United States Patent [19]
Bergemont et al.

[11] Patent Number: 5,477,485
[45] Date of Patent: Dec. 19, 1995

[54] METHOD FOR PROGRAMMING A SINGLE EPROM OR FLASH MEMORY CELL TO STORE MULTIPLE LEVELS OF DATA THAT UTILIZES A FLOATING SUBSTRATE

[75] Inventors: Albert Bergemont; Min-Hwa Chi, both of Palo Alto, Calif.

[73] Assignee: National Semiconductor Corporation, Santa Clara, Calif.

[21] Appl. No.: 392,087

[22] Filed: Feb. 22, 1995

[51] Int. Cl.[6] .................................................. G11C 11/40
[52] U.S. Cl. ...................... 365/185.24; 365/45; 365/168; 365/185.26
[58] Field of Search .......................... 365/185, 45, 168, 365/218, 900

[56] References Cited

U.S. PATENT DOCUMENTS

| | | | |
|---|---|---|---|
| 5,021,999 | 6/1991 | Kohda | 365/168 |
| 5,043,940 | 8/1991 | Harari | 365/168 |
| 5,394,362 | 2/1995 | Banks | 365/185 X |
| 5,418,743 | 5/1995 | Tomioka | 365/185 X |

OTHER PUBLICATIONS

T. Blyth et al., "A Non–Volatile Analog Storage Device Using EEPROM Technology", ISSCC91/Session 11/Emerging Circuit Technologies/Paper TP11.7, Feb. 14, 1991 (3 pages).
M. Horiguchi et al., "An Experimental Large–Capacity Semiconductor File Memory Using 16–Levels/Cell Storage", IEEE Journal of Solid–State Circuits, vol. 23, No. 1, Feb. 1988, pp. 27–33.
C. Bleiker et al. "A Four–State EEPROM Using Floating–Gate Memory Cells", IEEE Journal of Solid–State Circuits, vol. SC–22, No. 3, Jun. 1987, pp. 460–463.
N. Saks et al., "Observation of Hot–Hole Injection of NMOS Transistors Using a Modified Floating–Gate Technique", U.S. Government Publication (5 pages).
K. Oyama et al., "A Novel Erasing Technology for 3.3V Flash Memory with 64Mb Capacity and Beyond", 1992 IEEE, IEDM 92, pp. 607–610.
S. Yamada et al., "A Self–Convergence Erasing Scheme for a Simple Stacked Gate Flash EEPROM", 1991 IEEE, IEDM 91, pp. 307–310.
E. Takeda et al., "Device Performance Degradation Due to Hot–Carrier Injection at Energies Below the Si–SiO$_2$ Energy Barrier", 1983 IEEE, IEDM 83, pp. 396–399.
K. R. Hofmann et al., "Hot–Electron and Hole–Emission Effects in Short n–Channel MOSFET's", IEEE Transactions on Electron Devices, vol. ED–32, No. 3, Mar. 1985, pp. 691–699.
Y. Nissan–Cohen, "A Novel Floating–Gate Method for Measurement of Ultra–Low Hole and Electron Gate Currents in MOS Transistors", IEEE Electron Device Letters, vol. EDL–7, No. 10, Oct. 1986, pp. 561–563.
R. Bez et al., "A Novel Method for the Experimental Determination of the Coupling Ratios in Submicron EPROM and Flash EEPROM Cells", 1990 IEEE, IEDM 90, pp. 99–102.

*Primary Examiner*—David C. Nelms
*Assistant Examiner*—Son Mai
*Attorney, Agent, or Firm*—Limbach & Limbach

[57] ABSTRACT

Multiple logic levels can be programmed into a single EPROM or FLASH memory cell by applying one of a corresponding number of programming voltages to the control gate of a memory cell that is biased so that the source-to-substrate junction becomes forward-biased and the drain-to-substrate junction becomes reverse-biased. During programming, the bias conditions form substrate hot electrons which, in addition to the channel hot electrons, accumulate on the floating gate. By utilizing the substrate hot electrons, a much lower control gate voltage can be utilized during programming. More importantly, however, once the channel hot electrons cease to exist, the substrate hot electrons and holes converge to a stable charge that is related to the control gate voltage used during programming and the programmed threshold voltage of the cell.

5 Claims, 5 Drawing Sheets

METHOD FOR PROGRAMMING A SINGLE EPROM OR FLASH MEMORY CELL TO STORE MULTIPLE LEVELS OF DATA THAT UTILIZES A FLOATING SUBSTRATE

RELATED APPLICATION

The present application is related to commonly-assigned U.S. patent application Ser. No. 08/394,171, filed by Albert Bergemont et al. of even date herewith, for A METHOD FOR PROGRAMMING A SINGLE EPROM OR FLASH MEMORY CELL TO STORE MULTIPLE LEVELS OF DATA THAT UTILIZES A FORWARD-BIASED SOURCE-TO-SUBSTRATE JUNCTION.

BACKGROUND OF THE INVENTION

1. Field of the Invention

The present invention relates to floating gate memory cells and, more particularly, to a method for programming a single EPROM or FLASH memory cell to store multiple levels of data, i.e., more than a logic "1" and a logic "0".

2. Description of the Related Art

FIG. 1 shows a conventional n-channel, floating gate memory cell 10. As shown in FIG. 1, memory cell 10 includes an n-type source region 12 and an n-type drain region 14 which are formed a distance apart in a p-type substrate 16. The surface area of substrate 16 between the source and drain regions 12 and 14 defines a channel region 18 which is typically doped with additional p-type dopants (typically boron atoms) to adjust the threshold voltage of the cell.

Formed over the channel region 18 is a stacked gate structure which includes a gate oxide layer 20, a polysilicon floating gate 22 formed over gate oxide layer 20, an oxide-nitride-oxide (ONO) layer 24 formed over floating gate 22, and a polysilicon control gate 26 formed over ONO layer 24.

With 0.8 micron technology, where the channel length is approximately 0.8 microns, memory cell 10 is conventionally programmed to store one of two logic levels, i.e., a logic "1" or a logic "0", by grounding the source region 12 and substrate 16, applying a bias voltage VD in the range of 6–8 volts to the drain region 14, and applying a programming voltage VG of approximately 12 volts to control gate 26.

FIG. 2 shows the result of these bias conditions on memory cell 10. As shown in FIG. 2, when the programming voltage is applied to control gate 26, a positive potential is induced on floating gate 22. The positive potential on floating gate 22, in turn, attracts electrons from the doped p-type atoms in the channel region 18 to the surface of substrate 16 to form a channel 30, and also repels holes from the doped p-type impurity atoms to form a depletion region 32.

When the bias voltage VD is applied to the drain region 14, an electric field is established between the source and drain regions 12 and 14 in channel region 30 and depletion region 32. The electric field accelerates the electrons in channel 30 which, in turn, have ionizing collisions that form "channel hot electrons". The positive potential of floating gate 22 attracts these channel hot electrons which penetrate gate oxide layer 20 and begin accumulating on floating gate 22.

The negative charge on floating gate 22 that results from the accumulated electrons, in turn, directly corresponds to the threshold voltage required to induce a defined current to flow through memory cell 10. Thus, when a large negative charge has accumulated on floating gate 22, the threshold voltage of the cell is large because a larger positive voltage must be applied to control gate 26 to compensate for the negative charge on floating gate 22. Similarly, if the cell has not been programmed, the threshold voltage is small because a smaller voltage will induce current to flow through the cell.

The above-described process is self-limiting because, as the number of electrons on floating gate 22 increases, the potential of floating gate 22 decreases until the potential on floating gate 22 is insufficient to create channel 30.

When memory cell 10 is read, a reference threshold voltage is applied to control gate 26 to again induce a potential on floating gate 22. If memory cell 10 has not been programmed, the positive potential on floating gate 22 will cause channel 30 to again be formed. As a result, current flows from the drain region 14 to the source region 12 through channel 30.

If memory cell 10 has been programmed, the potential on floating gate 22 is reduced by the accumulated electrons so that a much smaller current flows through channel 30. By then comparing the current to a reference current, the magnitude of the current can be interpreted to be either a logic "1" or a logic "0". In other words, if the threshold voltage of the cell is larger than the reference threshold voltage, then one logic level is present, whereas if the threshold voltage of the cell is smaller than the reference threshold voltage, then the other logic level is present.

Historically, the density of memory arrays has been increased by reducing the feature sizes of the cells. As the feature sizes become ever smaller, however, this approach becomes more costly and more difficult to implement.

Another approach to increasing the density of a memory array is to program each cell to store more than two logic levels. As stated above, memory cells are conventionally programmed to store one of two logic levels, i.e., a logic "1" or a logic "0". However, if each memory cell could be programmed to store a logic "00", "01", "10", or "11", then the density of an array could be doubled without changing the physical size of the array.

In theory, multi-level programming could be accomplished by varying the length of time that the programming voltage is applied to the control gate. Thus, for example, if the programming voltage was applied for a first time period, the floating gate would reach a corresponding first negative charge level. Similarly, if the programming voltage was applied for either a second, third, or fourth time period, the floating gate would reach either a corresponding second, third, or fourth negative charge level.

The problem with this type of multi-level programming, however, is that it is difficult to precisely control the number of electrons that accumulate on the floating gate because the reduced floating gate potential that results from the electrons accumulating on the floating gate causes fewer electrons to be attracted to the floating gate, thereby causing the number of electrons accumulated on the floating gate to vary over time. The greater the variation, the more difficult it is to compare current levels during a read operation and determine which logic level is present. As a result, there is a need for a method to accurately program a cell to store multiple logic levels.

SUMMARY OF THE INVENTION

The present invention provides a method for accurately programming a single memory cell to store one of three or more logic levels. As a result, rather than storing either a logic "1" or a logic "0", a single memory cell can store, for example, a logic "0-0", a "0-1", a "1-0", and a "1-1".

In the present invention, the memory cell includes a source formed in a substrate, a drain formed in the substrate a distance apart from the source, a floating gate formed over the substrate, and a control gate formed over the floating gate.

A method for programming the memory cell to store one of three or more logic levels as one of three or more threshold voltages includes the step of selecting one of three or more programming voltages where the three or more programming voltages correspond to the three or more threshold voltages. After one of the programming voltages is selected, the substrate is floated, and a first voltage is applied to the source. In addition, a second voltage, which is larger than the first voltage, is applied to the drain. After this, the selected programming voltage is applied to the control gate of the memory cell for a predetermined time.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
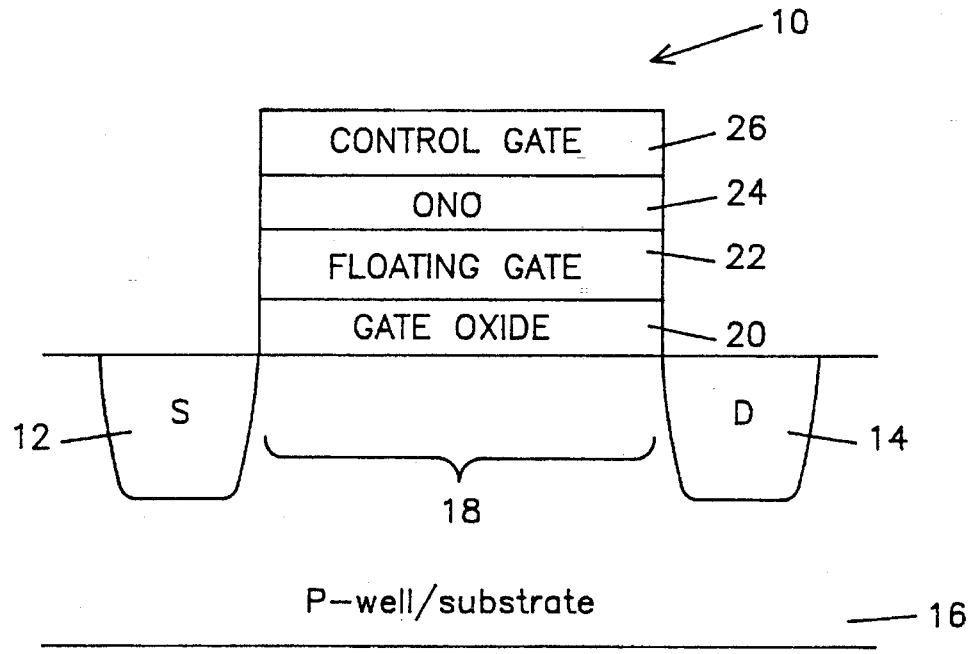
FIG. 1 is a cross-sectional drawing illustrating a conventional one-micron, n-channel, floating gate memory cell 10.
Figure 2:
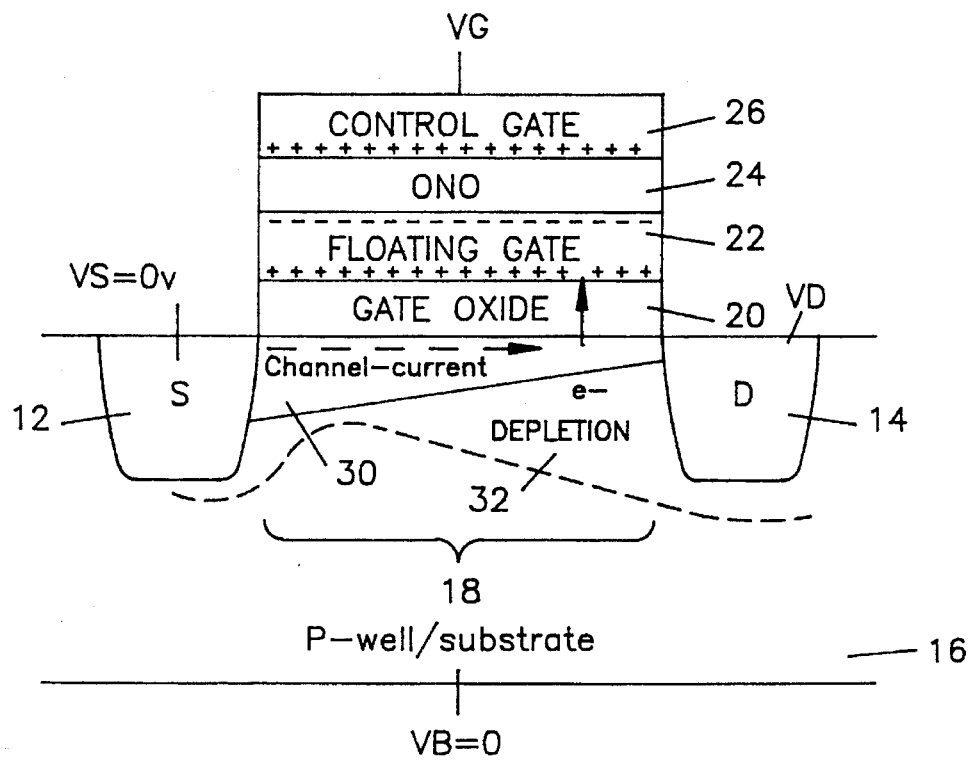
FIG. 2 is a cross-sectional drawing illustrating the bias conditions that result when memory cell 10 is programmed.
Figure 3:
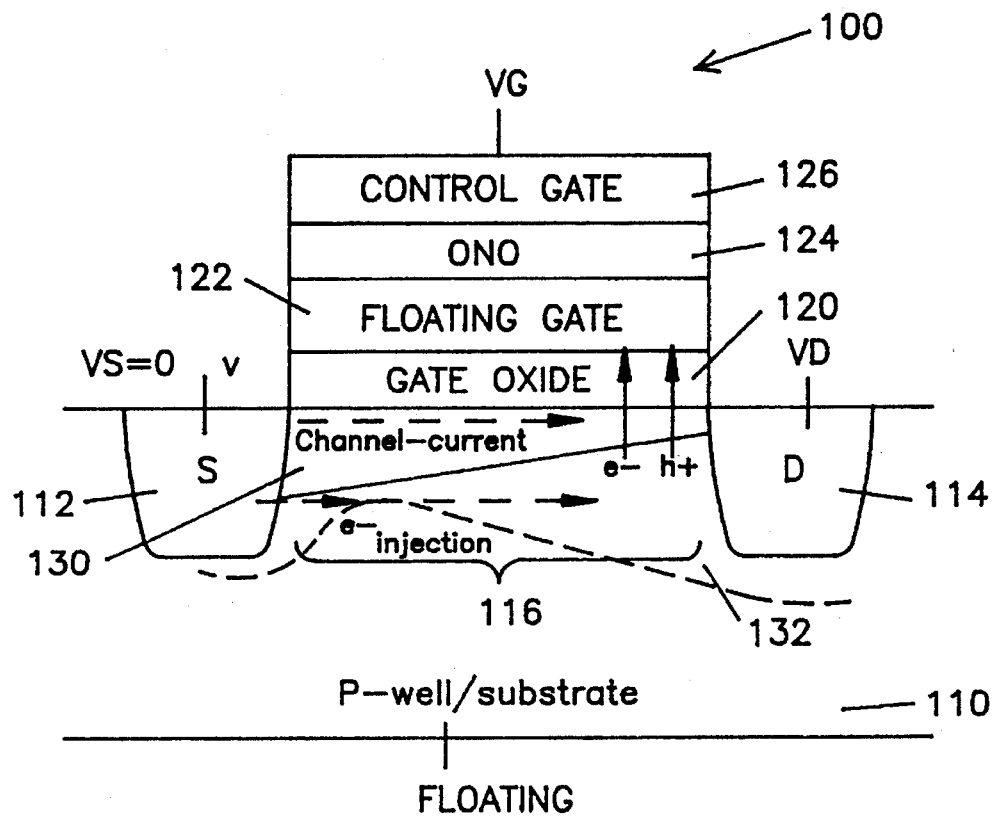
FIG. 3 is a cross-sectional drawing illustrating an n-channel, floating-gate memory cell 100 in accordance with the present invention.

FIG. 3 shows an n-channel, floating-gate memory cell 100 in accordance with the present invention. As described in greater detail below, one of three or more logic levels can be programmed into memory cell 100 by applying one of a corresponding three or more programming voltages to the control gate of memory cell 100 when the cell is biased to enhance the formation of substrate hot electrons.

As shown in FIG. 3, when formed in a p-type substrate 110, memory cell 100 includes an n-type source region 112, an n-type drain region 114, and a channel region 116 formed between the source and drain regions 112 and 114. Channel region 116, in turn, is doped with p-type impurity atoms to adjust the threshold voltage of the cell.

Memory cell 100 also includes a first insulation layer 120 formed over channel region 116, a floating gate 122 formed over insulation layer 120, a second insulation layer 124 formed over floating gate 122, and a control gate 126 formed over insulation layer 124.

In accordance with the present invention, memory cell 100 is programmed to store one of three or more logic levels by floating substrate 110, applying a first voltage to source 112, applying a second voltage to drain 114, where the second voltage is greater than the first voltage, and applying one of a corresponding three or more programming voltages to the control gate during programming. As described in greater detail below, these bias conditions cause the source-to-substrate junction to become forward-biased and the drain-to-substrate junction to become reverse-biased.

With 0.6 micron technology, memory cell 100 is preferably biased by grounding source 112, and applying a voltage VD in the range of 4–8 volts to drain 114. When more advanced technologies with smaller feature sizes are utilized, the range of preferable bias voltages can be reduced accordingly. Thus, for example, with 0.3 micron technology, drain 114 preferably utilizes a voltage VD in the range of 2 to 4 volts.

As a result of these bias conditions, one advantage of the present invention is that substantially lower voltages can be utilized to program cell 100 than the 12 volts that are conventionally used to program a cell. Thus, the method of the present invention is particularly applicable to low-power applications.

In operation, when one of the programming voltages is applied to control gate 126, a positive potential is induced on floating gate 122 which, in turn, attracts electrons from the doped p-type atoms in channel region 116 to the surface of substrate 110 to form a channel 130. This potential repels holes from the doped impurity atoms and forms a depletion region 132.

When the source and drain voltages are applied, an electric field is established between the source and drain regions 112 and 114. The electric field, as with conventional programming, accelerates the electrons in channel 130 which, in turn, have ionizing collisions that form channel hot electrons. The positive potential on floating gate 122 attracts these channel hot electrons which penetrate insulation layer 120 and begin accumulating on floating gate 122.

In addition to the formation of channel hot electrons, the present invention utilizes the bias conditions to enhance the formation of substrate hot electrons which also collect on floating gate 122. By grounding source 112, the maximum voltage that substrate 110 can reach is approximately 1.1 volts due to the bandgap of the silicon material. As a result, the drain-to-substrate junction is reverse-biased.

Due to the reverse-bias across the drain-to-substrate junction, a small, essentially constant leakage current flows from drain 114 to substrate 110. The leakage current results from thermally-generated minority carriers in the depletion region of the drain-to-substrate junction where electrons are swept to drain 114 and holes are swept to substrate 110 under the influence of the electric field. The magnitude of the leakage current is limited by the number of available minority carriers that are present in substrate 110.

Although substrate 110 is floating, the leakage current causes the potential of substrate 110 to rise which, in turn, slightly forward-biases the source-to-substrate junction.

With forward-biasing, the potential energy barrier across the source-to-substrate junction is lowered. This, in turn, allows a larger number of electrons to diffuse or be injected from source 112 to substrate 110 than is possible under equilibrium conditions. The electrons injected into substrate 110 as a result of the forward-biased source-to-substrate junction are attracted to drain 114 under the influence of the electric field. The increased number of electrons flowing into drain 114 increases the magnitude of the drain current which, in turn, increases the potential of substrate 110.

This process continues until a steady-state level is reached wherein substrate 110 reaches a potential of approximately 0.7 volts. At this point, the forward-bias across the source-to-substrate junction has substantially increased the number of minority carrier electrons that are present in substrate 110.

By increasing the number of minority carrier electrons in substrate 110 as a result of the forward-biased source-to-substrate junction, the number of minority carrier electrons which are accelerated towards drain 114 under the influence of the electric field is also increased. Some of the minority electron carriers in substrate 110 that are accelerated by the electric field, in turn, have ionizing collisions that form "substrate hot electrons". The positive potential on floating gate 122 also attracts these substrate hot electrons which penetrate insulation layer 120 and begin accumulating on floating gate 122.

Thus, as a result of this "bi-polar transistor effect", the number of minority carrier electrons which are accelerated towards drain 114 under the influence of the electric field, and thereby the number of substrate hot electrons that are formed, are controlled by the magnitude of the electric field. For example, a drain voltage of 4 volts will cause a relatively low number of substrate hot electrons to be formed, whereas a drain voltage of 8 volts will cause a substantially larger number of substrate hot electrons to be formed.

The principal advantage of floating substrate 110 over applying a defined voltage to substrate 110, such as 0.7 volts, is that substrate hot electrons can be more efficiently generated when substrate 110 is allowed to float. If a defined voltage was applied to substrate 110, then the entire length of the source-to-substrate boundary would be forward-biased. As a result, many electrons diffusing into substrate 110 are not significantly influenced by the electric field. These electrons, which simply recombine, increase the power consumed by the cell.

On the other hand, when substrate 110 is allowed to float, the leakage current tends to increase the potential of substrate 110 only along the portion of the source-to-substrate boundary that faces drain 114. As a result, fewer electrons diffuse away from drain 114. Thus, the majority of electrons which diffuse into substrate 110 are accelerated towards drain 114 under the influence of the electric field.

Figure 4:
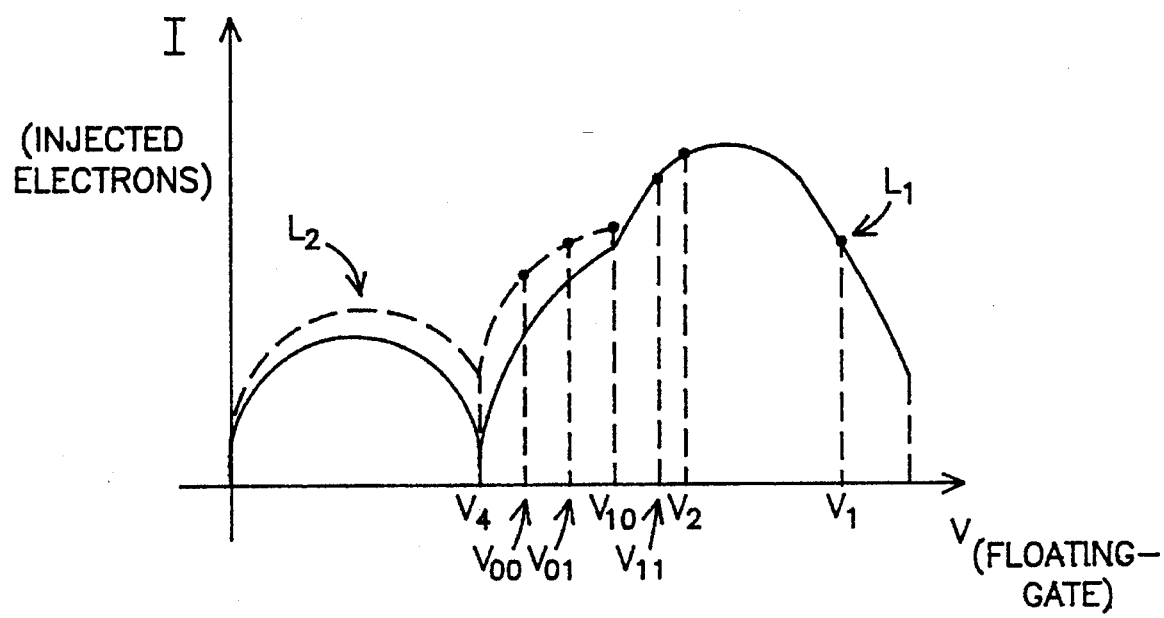
FIG. 4 is a graphical representation illustrating a cell programming characterization curve.

FIG. 4 shows a graphical representation that illustrates a cell programming characterization curve. As shown by lines $L_1$ and $L_2$ in FIG. 4, the voltage (V) on the floating gate influences the amount of hot electrons (I) that are injected onto the floating gate.

Conventionally, the primary consideration in programming memory cells is the time required to place a defined amount of negative charge on the floating gate of the cell. As a result, the typical memory cell is designed to utilize an initial floating gate voltage $V_1$ and a final floating gate voltage $V_2$ that are positioned on opposite sides of the peak of the curve shown in FIG. 4, thereby taking advantage of the maximum injection of hot electrons onto the floating gate. As described, the initial floating gate voltage $V_1$ represents the voltage capacitively coupled to the floating gate from the control gate, while the final floating gate voltage $V_2$ represents the initial voltage $V_1$ reduced by the accumulated negative charge.

Figure 5:
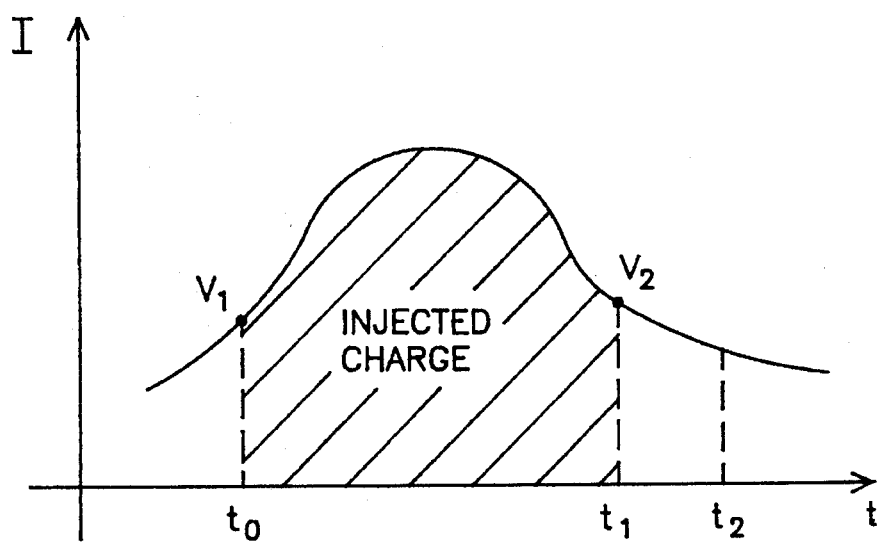
FIG. 5 is a graphical representation illustrating the current and the amount of negative charge injected onto the floating gate for initial and final floating-gate voltages $V_1$ and $V_2$.

FIG. 5 illustrates the amount of negative charge injected onto the floating gate for initial and final voltages $V_1$ and $V_2$. As shown in FIG. 5, the amount of charge injected on the floating gate can be determined by integrating under the curve from the initial voltage $V_1$ at time $t_0$ to the final voltage $V_2$ at time $t_1$.

More importantly, however, FIG. 5 illustrates that any variation in the timing will cause a greater or lesser amount of negative charge to be injected onto the floating gate. Thus, for example, if the programming is terminated at time $t_2$ rather than time $t_1$, a greater amount of charge will be injected.

With conventional programming, this additional (or lesser) amount of negative charge does not present any problems because the cell is only being programmed to one of two logic levels. Thus, as long as the cell is programmed to have a minimum amount of charge, any additional charge is acceptable.

However, with multi-level programming, the accumulation of additional negative charge makes it difficult to determine which logic level is represented by the charge. Thus, to insure that the charge is within a defined range, the timing must be precisely controlled. As stated above, this timing is very difficult to control.

The present invention achieves multiple levels of injected charge by utilizing one of a plurality of initial voltages. Since the initial voltages are defined by the voltage capacitively coupled to the floating gate from the control gate, the initial voltages are selected by selecting one of a plurality of control voltages.

For example, referring again to FIG. 4, voltage $V_{00}$, $V_{01}$, $V_{10}$, or $V_{11}$ may be selected as the initial voltage by selecting a corresponding control gate voltage. As further shown in FIG. 4, the present invention utilizes voltage $V_4$ as the final voltage. The significance of utilizing voltage $V_4$ as the final voltage can be seen in FIG. 6.

Figure 6:
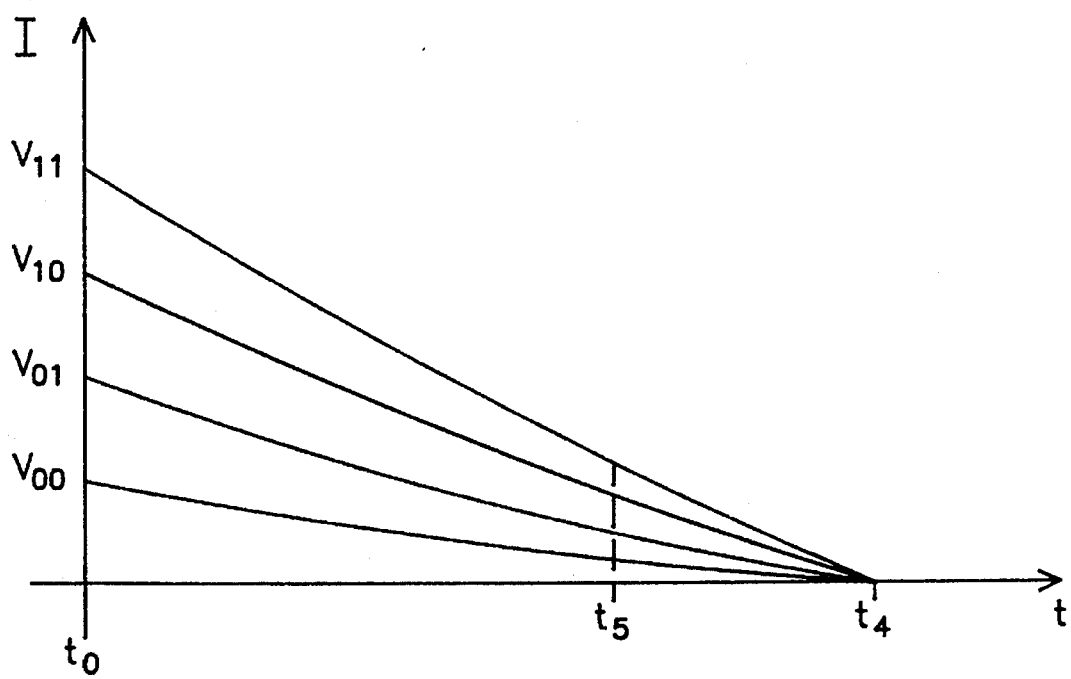
FIG. 6 is a graphical representation illustrating the current of negative charge injected onto the floating gate for initial floating-gate voltages $V_{00}$–$V_{11}$ and final voltage $V_4$.

FIG. 6 shows a graphical representation that illustrates the amount of negative charge injected onto the floating gate for initial voltages $V_{00}$–$V_{11}$ and final voltage $V_4$. As shown in FIG. 6, the amount of negative charge injected on the floating gate can be determined by integrating under the curve from each of the initial voltages $V_{00}$–$V_{11}$ at time $t_0$ to the final voltage $V_4$ at time $t_4$.

FIG. 6, however, also illustrates that because the injected charge converges towards zero for each initial voltage $V_{00}$–$V_{11}$, the injected charge is largely insensitive to timing variations. Thus, the floating gate can still have one of a plurality of discrete levels of injected charge if programming is terminated anytime between time $t_4$ and $t_5$ because the amount of additional charge during this time is so small.

One drawback of the approach, as described, is that the magnitude of the injected current drops as the voltage on the floating gate approaches the final voltage $V_4$ (see FIG. 4). As a result, it takes a greater amount of time to program the cell.

In accordance with the present invention, however, line L1 of FIG. 4 can be altered as shown by line L2 by increasing the formation of substrate hot electrons as described above. Thus, although the time required to program a memory cell in accordance with the present invention remains longer than conventional programming, the formation of substrate hot electrons substantially narrows the time difference.

Figure 7:
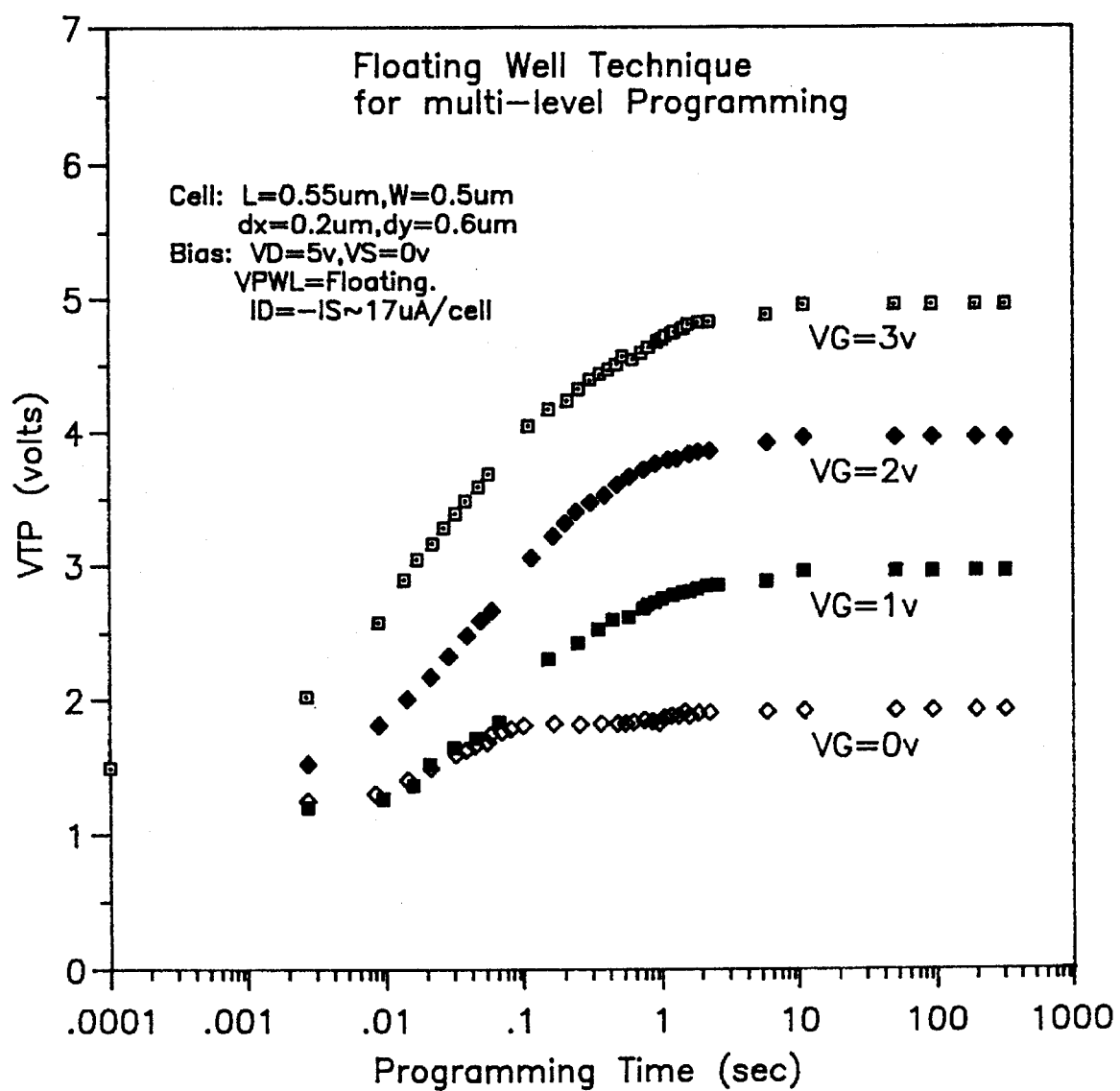
FIGS. 7 and 8 are graphical representations illustrating a series of experimental results.
Figure 8:
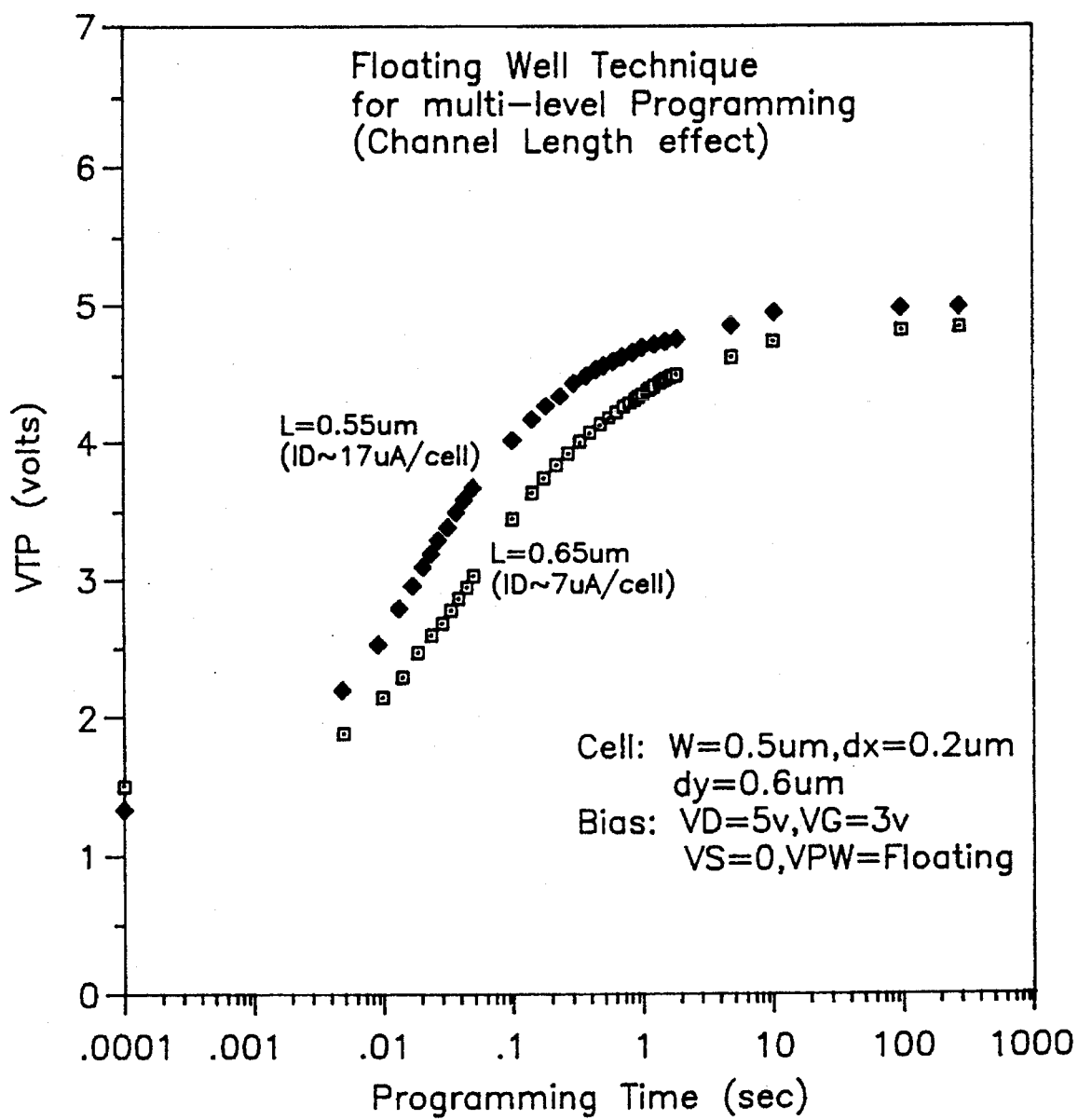

FIGS. 7 and 8 show graphical representations that illustrate a series of experimental results. As shown in FIG. 7, when zero volts were applied to the control gate, the charge on the floating gate converged to a threshold voltage (VTP) of approximately 2.0 volts from an initial threshold voltage of 1.5 volts within approximately 2 seconds. Similarly, when one, two, and three four volts were applied to the control gate, the charge on the floating gate converged to threshold voltages of approximately 3, 4, and 5 volts, respectively, within approximately 2 seconds. Although an initial threshold voltage of 1.5 volts was utilized in the above experiment, any initial threshold voltage after erase may be utilized.

Since the charge on the floating gate converges to a stable value which corresponds to a defined threshold voltage within approximately 2 seconds, a single floating gate memory cell can be programmed to have one of a plurality of threshold voltages by applying the corresponding voltage to the control gate during programming. As a result, a single floating gate memory cell can be utilized to store two or more bits of data.

For example, a 0-0 could be represented by a threshold voltage of 2 volts, while a 0-1 could be represented by a threshold voltage of 3 volts. Similarly, a 1-0 could be represented by a threshold voltage of 4 volts, while a 1-1 could be represented by a threshold voltage of 5 volts.

As further shown in FIG. 7, the experimental results also show that changes in the control gate voltage are linearly related to changes in the threshold voltage, i.e., a one volt increase in the control gate voltage increases the threshold voltage by one volt. As a result, memory cell 100 is not limited to representing two bits, but can represent any number of bits depending on the sensitivity of the current sense detectors utilized to discriminate one threshold voltage from another. Furthermore, even a continuous analog level can be stored in a cell as a threshold voltage.

Thus, for example, a 0-0-0 could be represented by a threshold voltage of 2 volts, while a 0-0-1 could be represented by a threshold voltage of 2.5 volts. Similarly, a 0-0-0-0 could be represented by a threshold voltage of 2 volts, while a 0-0-0-1 could be represented by a threshold voltage of 2.25 volts.

As shown in FIG. 7, the threshold voltages converge in about two seconds when −0.7 volts is applied to source region 112 and 5 volts is applied to drain region 114. The magnitude of the minority carrier injection, however, can be easily manipulated by varying the drain voltage level. As shown in FIG. 8, the convergence time can also be reduced by shorting the length of the channel.

As stated above and as shown in FIG. 7, one advantage of the present invention is that each memory cell can be programmed to store multiple levels by utilizing a programming voltage that is considerably less than the programming voltage typically used, i.e., less than five volts in the present invention compared to the approximately 12 volts that are conventionally used to program a cell. In addition to providing a substantial power savings for low power applications, such as notebook computers, the present invention eliminates the need for charge pumps on memory chips which are conventionally required to produce the programming voltage, i.e., 12 volts.

As is well known, charge pumps can consume a significant area, i.e., up to 30% of the total die area of a memory chip. Thus, by eliminating the need for charge pumps, the present invention significantly reduces the area required for a memory cell, and therefore the cost of a memory.

The elimination of high programming voltages also leads to an increase in the density of a memory array because less isolation is required between both memory cells and the peripheral circuitry. As a result, the present invention substantially reduces the size of the array and periphery circuits.

It should be understood that various alternatives to the embodiment of the invention described herein may be employed in practicing the invention. For example, although the present invention has been described in terms of an n-channel, floating-gate memory cell, the present invention equally applies to a p-channel, floating-gate memory cell.

Thus, it is intended that the following claims define the scope of the invention and that methods and structures within the scope of these claims and their equivalents be covered thereby.

What is claimed is:

1. A method for programming a single floating-gate memory cell to store one of three or more threshold voltages, the memory cell having a source formed in a substrate, a drain formed in the substrate a distance apart from the source, a floating gate formed over the substrate, and a control gate formed over the floating gate, the method comprising the steps of:

selecting one of three or more programming voltages as a selected programming voltage, the three or more programming voltages corresponding to said three or more threshold voltages;

floating the substrate;

applying a first voltage to the source;

applying a second voltage to the drain wherein the second voltage is greater than the first voltage; and applying the selected programming voltage to the control gate of the memory cell for a predetermined time.

2. The method of claim 1 wherein the first voltage includes ground.

3. The method of claim 1 wherein a maximum programming voltage is less than or equal to five volts.

4. The method of claim 1 wherein the predetermined time is less than or equal to two seconds.

5. The method of claim 1 wherein the second voltage falls within a range of four to eight volts.

* * * * *